United States Patent
Kaibuki et al.

(10) Patent No.: US 10,426,031 B2
(45) Date of Patent: Sep. 24, 2019

(54) FLEXIBLE PRINTED CIRCUIT BOARD AND METHOD FOR PRODUCING THE SAME

(71) Applicant: SUMITOMO ELECTRIC PRINTED CIRCUITS, INC., Koka-shi, Shiga (JP)

(72) Inventors: Tadahiro Kaibuki, Koka (JP); Kozo Sato, Koka (JP)

(73) Assignee: SUMITOMO ELECTRIC PRINTED CIRCUITS, INC., Koka-shi, Shiga (JP)

(*) Notice: Subject to any disclaimer, the term of this patent is extended or adjusted under 35 U.S.C. 154(b) by 0 days.

(21) Appl. No.: 15/520,152

(22) PCT Filed: Oct. 16, 2015

(86) PCT No.: PCT/JP2015/079260
§ 371 (c)(1),
(2) Date: Apr. 19, 2017

(87) PCT Pub. No.: WO2016/063799
PCT Pub. Date: Apr. 28, 2016

(65) Prior Publication Data
US 2017/0318674 A1    Nov. 2, 2017

(30) Foreign Application Priority Data

Oct. 24, 2014   (JP) ................................ 2014-217839

(51) Int. Cl.
*H05K 1/02*   (2006.01)
*H05K 1/03*   (2006.01)
(Continued)

(52) U.S. Cl.
CPC ............. *H05K 1/115* (2013.01); *H05K 1/028* (2013.01); *H05K 1/0393* (2013.01); *H05K 1/09* (2013.01);
(Continued)

(58) Field of Classification Search
CPC .......... H05K 1/115; H05K 1/028; H05K 1/09; H05K 3/0017; H05K 3/423; H05K 3/0026;
(Continued)

(56) References Cited

U.S. PATENT DOCUMENTS

| | | | | |
|---|---|---|---|---|
| 6,284,353 B1* | 9/2001 | Takada | ............... | H01L 23/49816 174/255 |
| 6,912,779 B2* | 7/2005 | Naitoh | .................... | H05K 3/423 29/846 |
| 7,943,861 B2* | 5/2011 | Iwai | .................... | H01L 21/4853 174/261 |
| 8,242,379 B2* | 8/2012 | Ikeda | ................... | H01L 21/4857 174/261 |

(Continued)

FOREIGN PATENT DOCUMENTS

JP   H08-316630 A   11/1996
JP   2007-036098 A   2/2007
(Continued)

*Primary Examiner* — Ishwarbhai B Patel
(74) *Attorney, Agent, or Firm* — Drinker Biddle & Reath LLP

(57) ABSTRACT

A method for producing a flexible printed circuit board according to an embodiment of the present invention includes a through-hole formation step of preparing a base material including a base film having insulating properties and flexibility and a pair of metal films stacked on both surface sides of the base film, and forming a through-hole in the metal film on a front surface side of the base material and the base film; a filling step of stacking, by electroplating on a front surface of the base material, stacking a conductive material on a surface of the metal film on the front surface side to form a conductive material layer and to fill the through-hole with the conductive material; and a removal step of removing, by etching the front surface of the base material, a surface layer of the conductive material layer stacked on the surface of the metal film on the front surface side and a surface layer of the conductive material filling the through-hole.

4 Claims, 5 Drawing Sheets

(51) Int. Cl.
*H05K 1/11* (2006.01)
*H05K 1/09* (2006.01)
*H05K 3/00* (2006.01)
*H05K 3/06* (2006.01)
*H05K 3/42* (2006.01)
*H05K 1/18* (2006.01)

(52) U.S. Cl.
CPC ......... *H05K 3/0017* (2013.01); *H05K 3/0026* (2013.01); *H05K 3/06* (2013.01); *H05K 3/423* (2013.01); *H05K 3/427* (2013.01); *H05K 1/189* (2013.01); *H05K 3/0035* (2013.01); *H05K 3/0038* (2013.01); *H05K 2201/09509* (2013.01); *H05K 2201/09563* (2013.01); *H05K 2203/0353* (2013.01); *H05K 2203/107* (2013.01)

(58) Field of Classification Search
CPC ............... H05K 3/06; H05K 2203/107; H05K 2201/09509
See application file for complete search history.

(56) References Cited

U.S. PATENT DOCUMENTS

| | | | | |
|---|---|---|---|---|
| 9,015,936 | B2* | 4/2015 | Hsu | H05K 3/108 |
| | | | | 174/254 |
| 9,516,764 | B2* | 12/2016 | Yoshida | H05K 3/421 |
| 2004/0078970 | A1 | 4/2004 | Naitoh et al. | |
| 2004/0136152 | A1* | 7/2004 | Mitsuhashi | H05K 3/4602 |
| | | | | 174/262 |
| 2005/0162835 | A1* | 7/2005 | Kogure | H05K 3/0055 |
| | | | | 361/720 |
| 2011/0247865 | A1* | 10/2011 | Tsurumi | H05K 3/4661 |
| | | | | 174/255 |
| 2013/0256007 | A1* | 10/2013 | Furutani | H05K 1/185 |
| | | | | 174/255 |

FOREIGN PATENT DOCUMENTS

| | | |
|---|---|---|
| JP | 2010-232590 A | 10/2010 |
| JP | 2014-138033 A | 7/2014 |
| JP | 2014-192483 A | 10/2014 |
| WO | WO 02/071818 A1 | 9/2002 |

* cited by examiner

FLEXIBLE PRINTED CIRCUIT BOARD AND METHOD FOR PRODUCING THE SAME

TECHNICAL FIELD

The present invention relates to a flexible printed circuit board and a method for producing the same.

BACKGROUND ART

Flexible printed circuit boards that include a flexible base film and conductive patterns disposed on a front surface and a back surface of the flexible base film are used as printed circuit boards.

In flexible printed circuit boards, flexibility decreases in portions subjected to plating, and thus the area subjected to plating is preferably as small as possible. Therefore, in such a flexible printed circuit board, pattern plating is usually performed, and land parts are formed by this plating together with through-holes and blind via-holes (refer to, for example, Patent Literature 1).

CITATION LIST

Patent Literature

PTL 1: Japanese Unexamined Patent Application Publication No. 8-316630

SUMMARY OF INVENTION

Technical Problem

In the flexible printed circuit board subjected to pattern plating, since a plating layer having a relatively large thickness with respect to the thickness of a conductive pattern is formed on land parts, flexibility decreases in portions where the land parts are provided. In addition, in the method including performing pattern plating, it is necessary to perform a step of forming a mask for forming land parts by pattern plating, which increases the man-hours and may result in an increase in the production cost.

The present invention has been made in view of the above circumstances. An object of the present invention is to provide a flexible printed circuit board having a low cost and good flexibility and a method for producing the flexible printed circuit board.

Solution to Problem

A method for producing a flexible printed circuit board according to an embodiment of the present invention, which has been made to solve the problems described above, includes a through-hole formation step of preparing a base material including a base film having insulating properties and flexibility and a pair of metal films stacked on both surface sides of the base film, and forming a through-hole in the metal film on a front surface side of the base material and the base film; a filling step of stacking, by electroplating on a front surface of the base material, a conductive material on a surface of the metal film on the front surface side to form a conductive material layer and to fill the through-hole with the conductive material; and a removal step of removing, by etching the front surface of the base material, a surface layer of the conductive material layer stacked on the surface of the metal film on the front surface side and a surface layer of the conductive material filling the through-hole.

A flexible printed circuit board according to another embodiment of the present invention, which has been made to solve the problems described above, includes a base film having insulating properties and flexibility, a first conductive pattern stacked on a front surface side of the base film, a second conductive pattern stacked on a back surface side of the base film, and a blind via-hole penetrating the first conductive pattern and the base film. The blind via-hole is a pillar-shaped filler of a conductive material formed in a through-hole penetrating the first conductive pattern and the base film. A front surface of the first conductive pattern has an arithmetic mean roughness Ra of 0.05 μm or more and 2 μm or less.

Advantageous Effects of Invention

The flexible printed circuit board has a low cost and good flexibility. According to the method for producing a flexible printed circuit board, a flexible printed circuit board having good flexibility can be produced at a low cost.

DESCRIPTION OF EMBODIMENTS

Figure 1:
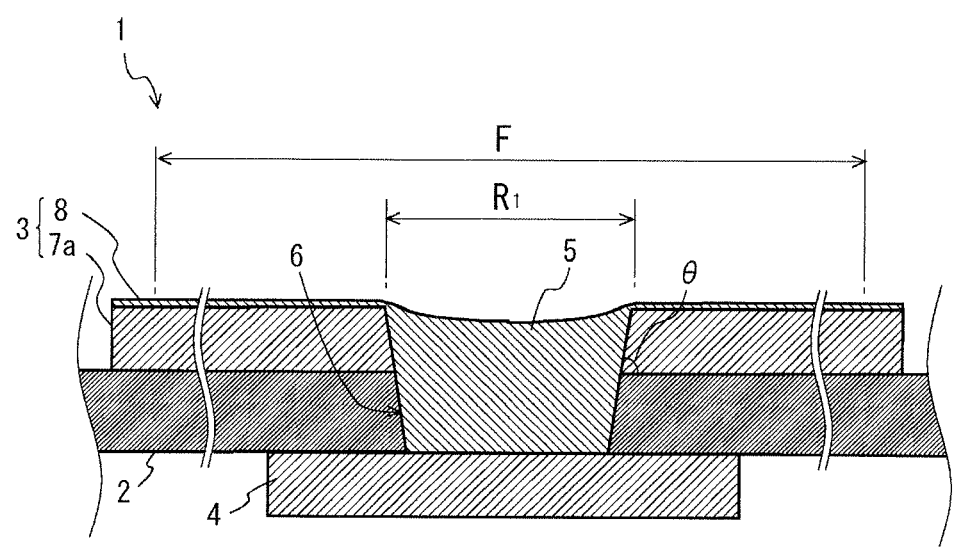
FIG. 1 is a schematic end view (the section is a surface perpendicular to a base film) illustrating a flexible printed circuit board according to a first embodiment of the present invention.

Description of Embodiments of the Present Invention

A method for producing a flexible printed circuit board according to an embodiment of the present invention includes a through-hole formation step of preparing a base material including a base film having insulating properties and flexibility and a pair of metal films stacked on both surface sides of the base film, and forming a through-hole in the metal film on a front surface side of the base material and the base film; a filling step of stacking, by electroplating on a front surface of the base material, a conductive material on a surface of the metal film on the front surface side to form a conductive material layer and to fill the through-hole with the conductive material; and a removal step of removing, by etching the front surface of the base material, a surface layer of the conductive material layer stacked on the surface of the metal film on the front surface side and a surface layer of the conductive material filling the through-hole.

The method for producing a flexible printed circuit board includes stacking, by electroplating, a conductive material on a surface of the metal film on the front surface side to form a conductive material layer and to fill a through-hole with the conductive material, and subsequently removing, by etching, a surface layer of the conductive material layer stacked on the surface of the metal film on the front surface side and a surface layer of the conductive material filling the through-hole. Accordingly, unlike the related art, a plating layer having a relatively large thickness is not formed on land parts. Therefore, flexibility is not impaired, and a flexible printed circuit board having high flexibility can be obtained. In the existing method including performing pattern plating, when a blind via-hole is formed by plating, it is necessary to form a land part connected to the blind via-hole at the same time. In contrast, according to the method for producing a flexible printed circuit board, when the through-hole is filled with a conductive material by electroplating, it is not necessary to form a land part connected to the blind via-hole. Therefore, unlike the related art, a step of forming a mask for forming such a land part is not necessary in the method for producing a flexible printed circuit board. Thus, the man-hours required to produce a flexible printed circuit board can be reduced to reduce the production cost.

In the through-hole formation step, a maximum inner diameter of a base film portion in the through-hole is preferably made larger than a minimum inner diameter of a metal film portion in the through-hole. In the through-hole formation step, by making a maximum inner diameter of a base film portion in the through-hole larger than a minimum inner diameter of a metal film portion in the through-hole, the blind via-hole subsequently formed by filling the through-hole with a conductive material in the filling step has a shape in which the blind via-hole is engaged by the metal film portion protruding into the through-hole with respect to the base film portion. Consequently, a blind via-hole that is unlikely to separate can be formed. In addition, the blind via-hole is in contact with a portion of the back surface of the metal film on the front surface side. Accordingly, the contact area between the blind via-hole and the metal film can be increased, and a flexible printed circuit board having higher reliability can be produced. Herein, the "minimum inner diameter of the metal film portion" means a diameter of a circle having an area corresponding to the smallest cross-sectional area of the cross-sectional areas perpendicular to the central axis of the through-hole in the metal film. The "maximum inner diameter of the base film portion" means a diameter of a circle having an area corresponding to the largest cross-sectional area of the cross-sectional areas perpendicular to the central axis of the through-hole in the base film.

In the removal step, an average thickness of the conductive material layer in a region within 0.2 mm from the center of the through-hole is preferably made to be 2 µm or less. When an average thickness of the conductive material layer on the front surface of the metal film around the through-hole is equal to or less than the upper limit, the effect of reducing flexibility by the conducive material layer can be reduced, and flexibility of the flexible printed circuit board can be further increased.

A surface of the metal film or the conductive material layer exposed on the front surface side after the removal step preferably has an arithmetic mean roughness Ra of 0.05 µm or more and 2 µm or less. When an arithmetic mean roughness of a surface of the metal film or the conductive material layer exposed on the front surface side after the removal of the surface layer of the conductive material layer stacked on the front surface of the metal film and the surface layer of the conductive material filling the through-hole is in the above range, adhesiveness with a coverlay is reliably obtained. Note that the "arithmetic mean roughness Ra" means an arithmetic mean roughness measured in accordance with JIS-B0601 (2013).

An average opening diameter of the through-hole is preferably 10 µm or more and 100 µm or less. When an average opening diameter of the through-hole is in the above range, a blind via-hole having high conductivity can be easily and reliably formed. Herein, the "opening diameter of the through-hole" means a diameter of a circle having an area corresponding to an opening area of a through-hole. The "average opening diameter of the through-hole" means an average of opening diameters of a plurality of through-holes.

The metal films are each preferably a copper foil, and the conductive material preferably contains copper as a main component. By using, as the metal film, a copper foil and, as the conductive material, a material containing copper as a main component, a flexible printed circuit board having high conductivity can be produced at a low cost. Herein, the term "main component" refers to a component contained in the largest amount and means a component having a content of, for example, 50% by mass or more.

A flexible printed circuit board according to another embodiment of the present invention includes a base film having insulating properties and flexibility, a first conductive pattern stacked on a front surface side of the base film, a second conductive pattern stacked on a back surface side of the base film, and a blind via-hole penetrating the first conductive pattern and the base film. The blind via-hole is a pillar-shaped filler of a conductive material formed in a through-hole penetrating the first conductive pattern and the base film. A front surface of the first conductive pattern has an arithmetic mean roughness Ra of 0.05 µm or more and 2 µm or less.

According to the flexible printed circuit board, since the front surface of the first conductive pattern has an arithmetic mean roughness Ra in the above range, the flexible printed circuit board has high adhesiveness with a coverlay. Such an arithmetic mean roughness Ra of the front surface of the first conductive pattern is achieved by etching. Specifically, the flexible printed circuit board is obtained by stacking, by electroplating, a conductive material on a surface of the metal film on the front surface side to form a conductive material layer and to fill a through-hole with the conductive material, and subsequently removing, by etching, a surface layer of the conductive material layer stacked on the surface of the metal film on the front surface side and a surface layer of the conductive material filling the through-hole. Accordingly, unlike the related art, a plating layer having a relatively large thickness is not formed on land parts, and thus the flexible printed circuit board has good flexibility. Furthermore, in producing the flexible printed circuit board, unlike the related art, a step of forming a mask for forming land parts is not necessary, and thus the flexible printed circuit board can be produced at a low cost.

When the first conductive pattern has a conductive material layer on the front surface thereof, the conductive material layer on the front surface of the first conductive pattern preferably has an average thickness of 2 µm or less in a region within 0.2 mm from the center of the blind via-hole. When an average thickness of the conductive material layer formed around the blind via-hole by electroplating is equal to or less than the upper limit, the effect of reducing flexibility by the conducive material layer can be suppressed, and flexibility can be increased.

A volume ratio of the blind via-hole relative to a capacity of the through-hole, which is filled with the conductive material to form the blind via-hole, is preferably 60% or more. When a volume ratio of the blind via-hole relative to a capacity of the through-hole is equal to or more than the lower limit, connection reliability between the first conductive pattern and the second conductive pattern can be more reliably improved. Herein, the "capacity of the through-hole" means a volume of a space defined by the inner wall of the base film that forms the through-hole, the inner wall of the first conductive pattern, the front surface of the second conductive pattern, and the opening surface.

An average diameter of the blind via-hole on a frontmost surface side is preferably 10 µm or more and 100 µm or less. When the average diameter of the blind via-hole on the frontmost surface side is in the above range, a blind via-hole having high conductivity can be formed easily and reliably. Herein, the "diameter of the blind via-hole on the frontmost surface side" means a diameter of a circle having an area corresponding to the area of an upper surface of the pillar-shaped filler on the front surface side. The "average diameter of the blind via-hole on the frontmost surface side" means an average of the diameter of a plurality of blind via-holes on the frontmost surface side.

The first conductive pattern and the conductive material preferably contain copper as a main component. By using, as the first conductive pattern and the conductive material, a material containing copper as a main component, high conductivity can be obtained at a low cost.

Details of Embodiments of the Present Invention

A flexible printed circuit board and a method for producing the flexible printed circuit board according to embodiments of the present invention will now be described with reference to the drawings. The term "front and back" in the embodiments of a flexible printed circuit board means, in the thickness directions of the flexible printed circuit board, directions in which one surface side is defined as "front" and the other surface side is defined as "back" and does not mean the front and back with respect to the usage conditions of the flexible printed circuit board.

First Embodiment

[Flexible Printed Circuit Board]

A flexible printed circuit board 1 illustrated in FIG. 1 is a so-called double-sided, and flexible substrate and includes a base film 2 having insulating properties and flexibility, a first conductive pattern 3 stacked on the front surface side of the base film 2, a second conductive pattern 4 stacked on the back surface side of the base film 2, and a blind via-hole 5 penetrating the first conductive pattern 3 and the base film 2.

(Base film)

The base film 2 is formed of a sheet-like member having flexibility. Specifically, a resin film can be used as the base film 2. For example, polyimide or polyethylene terephthalate is suitably used as the material of the resin film.

The lower limit of the average thickness of the base film 2 is preferably 5 µm, and more preferably 10 µm. The upper limit of the average thickness of the base film 2 is preferably 100 µm, and more preferably 50 µm. At an average thickness of the base film 2 of less than the lower limit, the base film 2 may have insufficient strength. On the other hand, an average thickness of the base film 2 exceeding the upper limit may be contrary to the requirement for a reduction in the thickness.

(First Conductive Pattern)

The first conductive pattern 3 includes a metal film 7a and a conductive material layer 8.

The metal film 7a is a layer stacked on the front surface side of the base film 2 and can be formed by using a metal film having conductivity. For example, a metal foil or a metal film formed by electrolytic plating can be used as the metal film. Examples of the metal that can be used to form the metal foil or the metal film include copper, nickel, aluminum, gold, and silver. Among these, copper, which has a low cost, high conductivity, and good adhesiveness with the base film 2, is preferably used. Furthermore, a rolled copper foil is preferable from the viewpoint that flexibility of the flexible printed circuit board 1 can be increased.

The lower limit of the average thickness of the metal film 7a is preferably 2 µm, and more preferably 5 µm. The upper limit of the average thickness of the metal film 7a is preferably 30 µm, and more preferably 20 µm. When the average thickness of the metal film 7a is less than the lower limit, conduction failure may easily occur. When the average thickness of the metal film 7a exceeds the upper limit, flexibility of the flexible printed circuit board 1 may be impaired.

The conductive material layer 8 is formed by stacking a conductive material on the front surface side of the metal film 7a by electroplating, and etching the resulting layer of the conductive material to form a thin film. Examples of the conductive material that can be used in the electroplating include copper, nickel, aluminum, gold, and silver. Among these, a conductive material containing copper as a main component is preferably used from the viewpoint of a low cost and high conductivity.

The upper limit of the average thickness of the conductive material layer 8 in a region (through-hole peripheral region F in FIG. 1) within 0.2 mm from the center of the blind via-hole 5 is preferably 2 µm, more preferably 1 µm, and still more preferably 0.5 µm. When the average thickness exceeds the upper limit, flexibility of the flexible printed circuit board 1 may be impaired.

(Second Conductive Pattern)

The second conductive pattern 4 is formed by etching a metal film stacked on the back surface side of the base film 2 to have a desired planar shape (pattern).

The second conductive pattern 4 can be formed by using a metal film having conductivity. For example, a metal foil such as a copper foil or a metal film formed by electrolytic plating can be used as the metal film. Examples of the metal that can be used to form the metal film include copper, nickel, aluminum, gold, and silver. Among these, copper, which has a low cost, high conductivity, and good adhesiveness with the base film 2, is preferably used. Furthermore, a rolled copper foil is preferable from the viewpoint that flexibility of the flexible printed circuit board 1 can be increased.

The lower limit of the average thickness of the second conductive pattern 4 is preferably 2 μm, and more preferably 5 μm. The upper limit of the average thickness of the second conductive pattern 4 is preferably 30 μm, and more preferably 20 μm. When the average thickness of the second conductive pattern 4 is less than the lower limit, conduction failure may easily occur. When the average thickness of the second conductive pattern 4 exceeds the upper limit, flexibility of the flexible printed circuit board 1 may be impaired.

Examples of the method for controlling the average thickness of the second conductive pattern 4 to the above range include a method including etching a back surface of a metal film 7b, a method including mechanically polishing a back surface of a metal film 7b, and a method including forming a thin conductive layer on a back surface of the base film 2 by sputtering or vapor deposition, and then forming a thin metal film by electroplating. From the viewpoint of the production cost, the method including etching a back surface of a metal film 7b is preferable.

(Blind Via-Hole)

The blind via-hole 5 is a pillar-shaped filler of a conductive material formed by electroplating in a through-hole 6 penetrating the first conductive pattern 3 and the base film 2. As illustrated in FIG. 1, the blind via-hole 5 penetrates the first conductive pattern 3 and the base film 2.

The blind via-hole 5 continues from the conductive material layer 8, a bottom surface of the blind via-hole 5 is in contact with the second conductive pattern 4, and a sidewall of the blind via-hole 5 is in contact with the metal film 7a. With this structure, the blind via-hole 5 electrically connects the first conductive pattern 3 and the second conductive pattern 4.

The lower limit of an average opening diameter $R_1$ of the through-hole 6 filled with the conductive material that forms the blind via-hole 5 is preferably 10 μm, and more preferably 30 μm. The upper limit of the average opening diameter $R_1$ is preferably 100 μm, and more preferably 80 μm. When the average opening diameter $R_1$ is less than the lower limit, it is difficult to fill the through-hole 6 with the conductive material, and sufficient conductivity may not be obtained. When the average opening diameter $R_1$ exceeds the upper limit, it takes a long time to fill the through-hole 6 with the conductive material by electroplating, and flexibility of the flexible printed circuit board 1 may be impaired.

Since the blind via-hole 5 is a pillar-shaped filler formed by filling the through-hole 6 with a conductive material by electroplating, the average diameter of the blind via-hole 5 on the frontmost surface side of the blind via-hole 5 is substantially equal to the average opening diameter $R_1$ of the through-hole 6.

The lower limit of the average diameter of the blind via-hole 5 on the frontmost surface side is preferably 10 μm, and more preferably 30 μm. The upper limit of the average diameter of the blind via-hole 5 on the frontmost surface side is preferably 100 μm, and more preferably 80 μm. When the average diameter of the blind via-hole 5 on the frontmost surface side is less than the lower limit, sufficient conductivity may not be obtained. When the average diameter of the blind via-hole 5 on the frontmost surface side exceeds the upper limit, flexibility of the flexible printed circuit board 1 may be impaired.

The lower limit of an arithmetic mean roughness Ra of a front surface of the conductive material layer 8 is 0.05 μm, preferably 0.1 μm, and more preferably 0.2 μm. The upper limit of the arithmetic mean roughness Ra of the front surface of the conductive material layer 8 is 2 μm, preferably 1 μm, and more preferably 0.7 μm. When the arithmetic mean roughness Ra of the front surface of the conductive material layer 8 is less than the lower limit, adhesiveness between the first conductive pattern 3 and a coverlay may be insufficient. When the arithmetic mean roughness Ra of the front surface of the conductive material layer 8 exceeds the upper limit, transmission delay and transmission loss of high-frequency characteristic signals may increase.

When the blind via-hole 5 has a shape in which the surface of the blind via-hole 5 protrudes toward the front surface side, a volume ratio of the blind via-hole 5 relative to the capacity of the through-hole 6 exceeds 100%. The lower limit of the volume ratio of the blind via-hole 5 is preferably 60%, more preferably 70%, and still more preferably 80%. The upper limit of the volume ratio of the blind via-hole 5 is preferably 150%. When the volume ratio of the blind via-hole 5 is less than the lower limit, connection reliability between the first conductive pattern and the second conductive pattern may decrease. When the volume ratio of the blind via-hole 5 exceeds the upper limit, a large protrusion is formed on the flexible printed circuit board 1, and, for example, a contact with other wiring may occur. Note that the "capacity of the through-hole 6" is the volume of a space defined by the inner wall of the base film 2 and the inner wall of the metal film 7a, which form the through-hole 6, the front surface of the second conductive pattern 4, and the opening surface.

Since the through-hole 6 to be filled with a conductive material is formed from the front surface side, a cross-sectional area perpendicular to the central axis of the through-hole 6 increases toward the front surface side. Accordingly, the inner wall surfaces of the metal film 7a and the base film 2 that form the through-hole 6 are inclined with respect to the front surface of the base film 2 as illustrated in FIG. 1. The lower limit of an inclination angle θ of the inner wall surface of the metal film 7a in a section including the central axis of the through-hole 6 with respect to the front surface of the base film 2 is preferably 60°, and more preferably 70°. The upper limit of the inclination angle θ is preferably 89°, and more preferably 85°. When the inclination angle θ is less than the lower limit, the contact area between the blind via-hole 5 and the second conductive pattern 4 is excessively small, and sufficient conductivity may not be obtained. When the inclination angle θ exceeds the upper limit, it is difficult to form the through-hole 6, and expensive facilities may be necessary.

[Method for Producing Flexible Printed Circuit Board]

A method for producing the flexible printed circuit board 1 includes a step (through-hole formation step) of preparing a base material 9 including a base film 2 having insulating properties and flexibility and a pair of metal films 7a and 7b stacked on both surface sides of the base film 2, and forming a through-hole 6 in the metal film 7a on a front surface side of the base material 9 and the base film 2; a step (filling step) of stacking, by electroplating on a front surface of the base material 9, a conductive material on a surface of the metal film 7a on the front surface side to form a conductive material layer 8 and to fill the through-hole 6 with the conductive material; and a step (removal step) of removing, by etching the front surface of the base material 9, a surface layer of the conductive material layer stacked on the surface of the metal film 7a on the front surface side and a surface layer of the conductive material filling the through-hole 6.
(Through-Hole Formation Step)

Figure 2A:
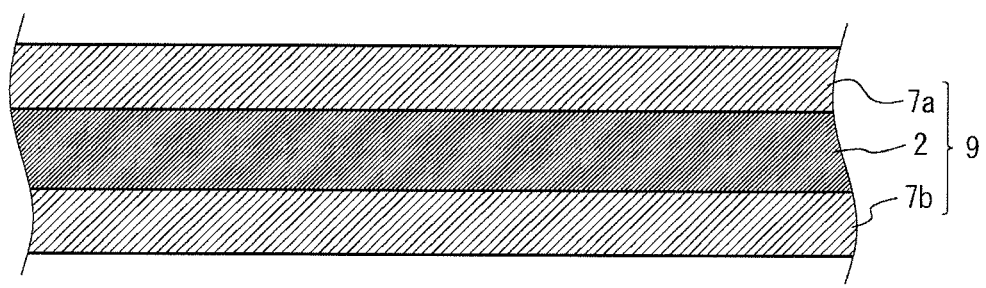
FIG. 2A is a schematic sectional view illustrating a method for producing the flexible printed circuit board in FIG. 1.

In the through-hole formation step, a base material 9 in which a pair of metal films 7a and 7b are stacked on both surface sides of a base film 2 is prepared as illustrated in FIG. 2A.

The method for forming the base material 9 in which a pair of metal films 7a and 7b are stacked on both surface sides of a base film 2 is not particularly limited. Examples of the method that can be used include a bonding method including bonding the metal films 7a and 7b to the base film 2 with an adhesive, a casting method including applying a resin composition, which is a material of the base film 2, onto the metal film 7a, a sputtering/plating method including forming a thin conductive layer (seed layer) having a thickness of several nanometers on the base film 2 by sputtering or vapor deposition, and forming the metal films 7a and 7b by electrolytic plating on the conductive layer, and a lamination method including bonding the metal films 7a and 7b to the base film 2 by heat pressing. A commercially available copper clad laminate may be used as the base material 9.

Figure 2B:
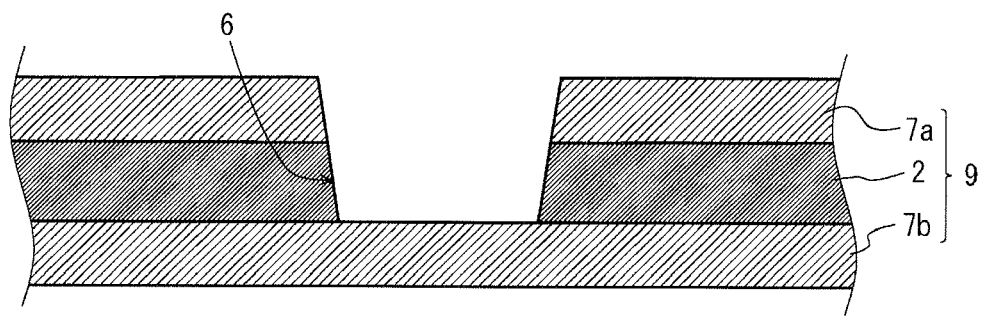
FIG. 2B is a schematic sectional view illustrating a step of producing the flexible printed circuit board in FIG. 1, the step being performed subsequent to the step illustrated in FIG. 2A.

Next, the metal film 7a on the front surface side of the base material 9 illustrated in FIG. 2A is machined with a laser, and the base film 2 is subsequently machined with a laser to form a through-hole 6 in the laminate including the metal film 7a on the front surface side and the base film 2, as illustrated in FIG. 2B. After laser irradiation, desmearing is preferably performed to remove residues.

The through-hole 6 may be formed by another method. For example, a resist film having an opening at a position where a through-hole is to be formed is stacked on the front surface side of the base material 9, and the metal film 7a on the front surface side is etched by using the resist film as a mask pattern. The resist film is removed, and the base film 2 is then irradiated with a laser by using the metal film 7a as a mask pattern. The through-hole 6 continuous to the metal film 7a and the base film 2 is thereby formed as illustrated in FIG. 2B.
(Filling Step)

Figure 2C:
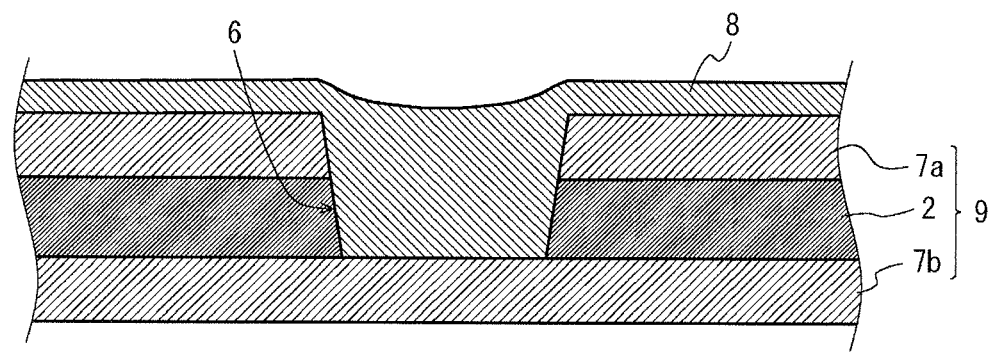
FIG. 2C is a schematic sectional view illustrating a step of producing the flexible printed circuit board in FIG. 1, the step being performed subsequent to the step illustrated in FIG. 2B.

In the filling step, as illustrated in FIG. 2C, a conductive material is stacked on a surface of the metal film 7a on the front surface side by electroplating to form a conductive material layer 8 and to fill the through-hole 6 with the conductive material.

Via-filling plating is applied to the electroplating. Specifically, the plating is performed by, for example, a method in which the laminate illustrated in FIG. 2B is immersed in a copper sulfate plating solution containing a plating inhibitor that inhibits plating growth and a plating accelerator that accelerates plating growth and a current is supplied. The plating inhibitor does not easily adsorb to the inside of the through-hole 6 but easily adsorbs to the surface of the metal film 7a in accordance with the law of diffusion of substances. Accordingly, copper is preferentially deposited in the through-hole 6 and the through-hole 6 is filled with the conductive material. A plating film may be stacked on the metal film 7b stacked on the back surface side of the base film 2. However, in order to prevent the thickness of the flexible printed circuit board 1 from increasing, preferably, no current is allowed to flow in the metal film 7b on the back surface side so that a plating film is not stacked.

Examples of the plating accelerator that can be used include sulfur compounds represented by sodium 3-mercapto-1-propanesulfonate or sodium 2-mercaptoethanesulfonate; and sulfur compounds represented by bis-(3-sulfopropyl)-disulfide disodium. Examples of the plating inhibitor that can be used include polyether compounds such as polyalkylene glycols, and nitrogen-containing compounds such as polyvinylimidazolium quaternary compounds and copolymers of vinylpyrrolidone and a vinylimidazolium quaternary compound. The types and the amounts of plating accelerator and plating inhibitor mixed are determined in accordance with, for example, the shape, the size, and the arrangement density of the blind via-hole 5 formed.
(Removal Step)

Figure 2D:
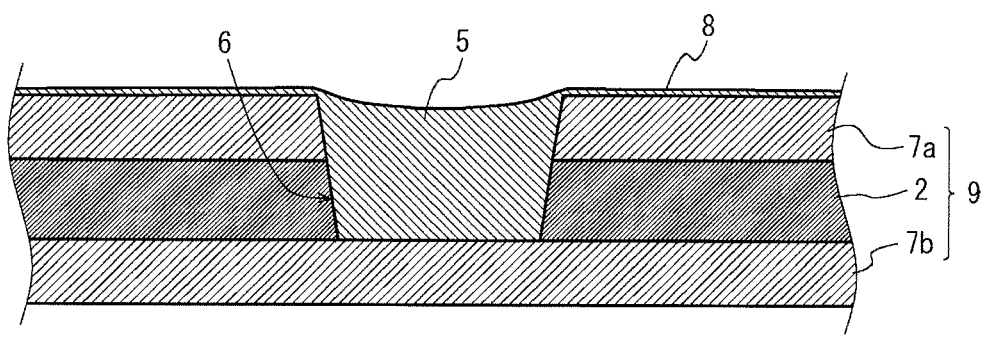
FIG. 2D is a schematic sectional view illustrating a step of producing the flexible printed circuit board in FIG. 1, the step being performed subsequent to the step illustrated in FIG. 2C.

In the removal step, the front surface of the base material 9 in FIG. 2C is etched to remove a surface layer of the conductive material layer 8 stacked on the surface of the metal film 7a on the front surface side and a surface layer of the conductive material filling the through-hole 6. Thus, a blind via-hole 5 and a thin film-like conductive material layer 8 are formed as illustrated in FIG. 2D.

In order to etch the surface layer of the conductive material layer 8 stacked on the surface of the metal film 7a and the surface layer of the conductive material filling the through-hole 6, specifically, these surface layers are removed by using an etchant. For example, sulfuric acid-hydrogen peroxide mixture (mixture of sulfuric acid and hydrogen peroxide) or sodium persulfate can be used as the etchant. During the etching, a mask may be formed on the metal film 7b on the back surface side. Alternatively, the metal film 7b may be etched, without forming a mask, at the same time of the etching of the metal film 7a on the front surface side. By etching the metal film 7b on the back surface side, the average thickness of the second conductive pattern 4 can be reduced to further improve flexibility of the flexible printed circuit board 1.

The conductive material layer 8 formed by plating is harder than the metal film 7a formed by rolling. Therefore, with a decrease in the thickness of the conductive material layer 8 by etching in the removal step, flexibility of the flexible printed circuit board 1 can be more significantly improved.

Furthermore, the front surface of the conductive material layer 8 is roughened by the etching and has an arithmetic mean roughness Ra in the range described above.

The etching is preferably half-etching by which only the conductive material layer 8 is easily dissolved as much as possible by controlling the etching balance.

After the blind via-hole 5 and the thin film-like conductive material layer 8 are formed as illustrated in FIG. 2D, a resist film having a predetermined shape is stacked on the front surface of the metal film 7a and the conductive material layer 8, and a first conductive pattern 3 is formed by etching as illustrated in FIG. 1. Similarly, a resist film having a predetermined shape is stacked on the back surface of the metal film 7b on the back surface side, and a second conductive pattern 4 is formed by etching as illustrated in FIG. 1. Consequently, the flexible printed circuit board 1 is obtained.

In the production method described herein, after the removal step is performed, the metal films 7a and 7b and the conductive material layer 8 are processed by etching so as to have desired patterns. Alternatively, before the filling step, the metal films 7a and 7b may be subjected to processing so as to have desired patterns. Alternatively, the metal films 7a and 7b may be processed with a laser so as to have desired patterns at the same time when the through-hole is formed in the through-hole formation step.

Advantages

According to the method for producing a flexible printed circuit board, a conductive material is stacked on the surface of the metal film 7a on the front surface side by electroplating to form the conductive material layer 8 and to fill the through-hole 6 with the conductive material, and a surface layer of the conductive material layer 8 stacked on the surface of the metal film 7a on the front surface side and a surface layer of the conductive material filling the through-hole 6 are then removed by etching. Accordingly, unlike the related art, a plating layer having a relatively large thickness is not formed on land parts. Therefore, flexibility is not impaired, and a flexible printed circuit board having high flexibility can be produced. According to the method for producing a flexible printed circuit board, unlike the related art, when a blind via-hole is formed by plating, it is not necessary to form a land part connected to the blind via-hole at the same time. Therefore, unlike the related art, it is not necessary to perform a step of forming a mask for forming such a land part, and thus the man-hours required to produce a flexible printed circuit board can be reduced to reduce the production cost.

Since the flexible printed circuit board 1 has an arithmetic mean roughness Ra of a front surface within the above range, high adhesiveness with a coverlay is obtained. According to the flexible printed circuit board, since the conductive material layer 8 stacked on the surface of the metal film 7a has a small thickness, irregularities of the surface are smaller than those of existing flexible printed circuit boards.

Second Embodiment

Figure 3:
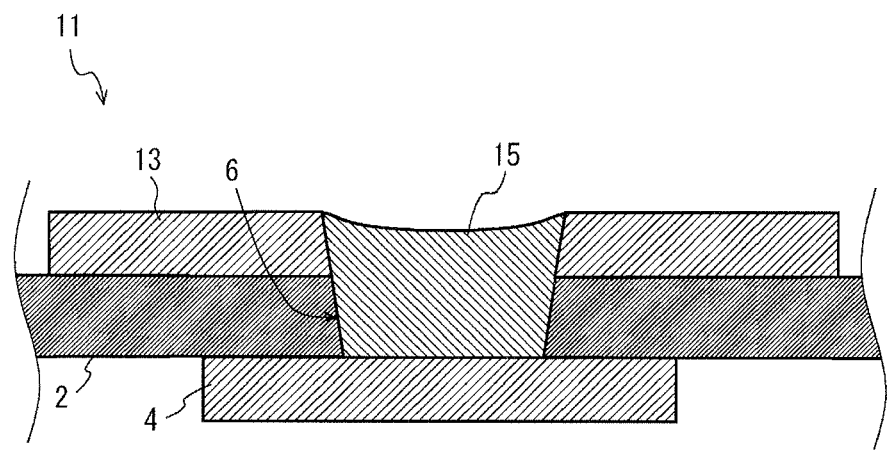
FIG. 3 is a schematic end view (the section is a surface perpendicular to a base film) illustrating a flexible printed circuit board according to a second embodiment of the present invention.

A flexible printed circuit board 11 illustrated in FIG. 3 is a so-called double-sided, and flexible substrate and includes a base film 2 having insulating properties and flexibility, a first conductive pattern 13 stacked on the front surface side of the base film 2, a second conductive pattern 4 stacked on the back surface side of the base film 2, and a blind via-hole 15 penetrating the first conductive pattern 13 and the base film 2.

The flexible printed circuit board 11 differs from the flexible printed circuit board 1 in FIG. 1 in that the first conductive pattern 13 does not include a conductive material layer. A description of the same structure as the flexible printed circuit board 1 is omitted, and a feature different from the flexible printed circuit board 1 will be described below.

(First Conductive Pattern)

The first conductive pattern 13 is a layer formed by exposing a metal film 7a on the front surface side and performing etching on a front surface of the metal film 7a.

The lower limit of the average thickness of the first conductive pattern 13 is preferably 2 µm, and more preferably 5 µm. The upper limit of the average thickness of the first conductive pattern 13 is preferably 30 µm, and more preferably 20 µm. When the average thickness of the first conductive pattern 13 is less than the lower limit, conduction failure may easily occur. When the average thickness of the first conductive pattern 13 exceeds the upper limit, flexibility of the flexible printed circuit board 11 may be impaired.

The lower limit of the arithmetic mean roughness Ra of the front surface of the first conductive pattern 13 is 0.05 µm, preferably 0.1 µm, and more preferably 0.2 µm. The upper limit of the arithmetic mean roughness Ra of the front surface of the first conductive pattern 13 is 2 µm, preferably 1 µm, and more preferably 0.7 µm. When the arithmetic mean roughness Ra of the front surface of the first conductive pattern 13 is less than the lower limit, adhesiveness between the first conductive pattern 13 and a coverlay may be insufficient. When the arithmetic mean roughness Ra of the front surface of the first conductive pattern 13 exceeds the upper limit, transmission delay and transmission loss of high-frequency characteristic signals may increase.

(Blind Via-Hole)

The blind via-hole 15 is a pillar-shaped filler of a conductive material formed by electroplating in a through-hole penetrating the first conductive pattern 13 and the base film 2. As illustrated in FIG. 3, the blind via-hole 15 penetrates the first conductive pattern 13 and the base film 2.

The blind via-hole 15 is formed by removing the conductive material layer 8 in FIG. 2C and removing a surface layer of the conductive material layer 8 by etching. Accordingly, the front surface of the blind via-hole 15 is continued to the inner side surface of the first conductive pattern 13 on the opening edge of the through-hole 6.

The flexible printed circuit board 11 can be produced by, for example, a method similar to the production method of the first embodiment. Specifically, the flexible printed circuit board 11 can be produced by increasing the time of etching in the removal step of the first embodiment. By increasing the time of etching, the conductive material layer 8 illustrated in FIG. 2C is removed to expose the front surface of the metal film 7a. In this case, the surface layer of the metal film 7a may be further removed by etching as long as the average thickness of the first conductive pattern 13 is within the above range.

By performing etching on the front surface of the metal film 7a, the front surface of the metal film 7a is roughened, and the front surface of the first conductive pattern 13 has an arithmetic mean roughness Ra within the range described above.

Advantages

According to the flexible printed circuit board, land parts around blind via-holes can be eliminated or reduced in size. Thus, the limitation to the design of a circuit pattern can be reduced, and a high-accuracy circuit can be formed.

Furthermore, the flexible printed circuit board does not include a conductive material layer, which is formed by plating and is harder than the metal film 7a formed by rolling. Thus, flexibility is further increased, and irregularities on the front surface are further reduced.

Third Embodiment

[Flexible Printed Circuit Board]

Figure 4:
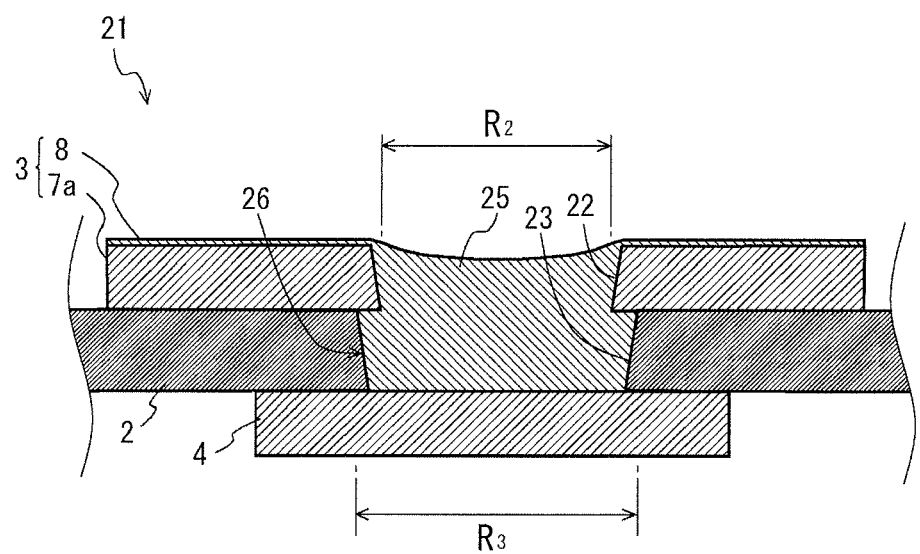
FIG. 4 is a schematic end view (the section is a surface perpendicular to a base film) illustrating a flexible printed circuit board according to a third embodiment of the present invention.

A flexible printed circuit board 21 illustrated in FIG. 4 is a so-called double-sided, and flexible substrate and includes a base film 2 having insulating properties and flexibility, a first conductive pattern 3 stacked on the front surface side of the base film 2, a second conductive pattern 4 stacked on the back surface side of the base film 2, and a blind via-hole 25 penetrating the first conductive pattern 3 and the base film 2.

The flexible printed circuit board 21 in FIG. 4 differs from the flexible printed circuit board 1 in FIG. 1 in that a metal film layer inner wall 22 and a base film inner wall 23 that form a through-hole 26 are discontinuous whereas the inner wall surface of the metal film 7a and the base film 2 that form the through-hole 6 of the flexible printed circuit board 1 in FIG. 1 are continuous. A description of the same structure as the flexible printed circuit board 1 is omitted, and a feature different from the flexible printed circuit board 1 will be described below.

(Blind Via-Hole)

The blind via-hole 25 is a pillar-shaped filler of a conductive material formed by electroplating in the through-hole 26 penetrating the first conductive pattern 3 and the base film 2. As illustrated in FIG. 4, the blind via-hole 25 penetrates the first conductive pattern 3 and the base film 2.

As illustrated in FIG. 4, a maximum inner diameter $R_3$ of the base film inner wall 23 that forms the through-hole 26 is larger than a minimum inner diameter $R_2$ of the metal film layer inner wall 22 that forms the through-hole 26. This is because, after the through-hole 26 is formed and before the through-hole 26 is filled with a conductive material, the base film inner wall 23 is recessed with respect to the metal film layer inner wall 22 by, for example, a desmear treatment.

Since the through-hole 26 is formed from the front surface side, cross-sectional areas of the through-hole 26 in the metal film layer inner wall 22 and the base film inner wall 23, the cross-sectional areas being perpendicular to the central axis of the through-hole 26, each increase toward the front surface side. Accordingly, the inner diameter of the through-hole 26 on the backmost surface side of a metal film 7a corresponds to the minimum inner diameter $R_2$ of a metal film portion, and the inner diameter of the through-hole 26 on the frontmost surface side of the base film 2 corresponds to the maximum inner diameter $R_3$ of a base film portion. Since the maximum inner diameter $R_3$ of the base film portion is larger than the minimum inner diameter $R_2$ of the metal film portion, the through-hole 26 has a shape in which the cross-sectional area discontinuously increases in a connecting portion between the metal film 7a and the base film 2, when viewed from the front surface side. The blind via-hole 25 is formed by filling the through-hole 26 having such a shape with a conductive material. Accordingly, the blind via-hole 25 has a shape in which the blind via-hole 25 is engaged by the metal film 7a portion protruding into the through-hole 26 with respect to the base film 2 portion, and thus the blind via-hole 25 is unlikely to separate toward the front surface side.

In addition, since the base film inner wall 23 is recessed with respect to the metal film layer inner wall 22, the maximum inner diameter $R_3$ of the base film 2 portion in the through-hole 26 is larger than the minimum inner diameter $R_2$ of the metal film 7a portion in the through-hole 26, and a portion that is not in contact with the base film 2 is generated on the back surface of the metal film 7a. The blind via-hole 25 is in contact with the portion of the back surface of the metal film 7a, the portion being not in contact with the base film 2. Accordingly, the contact area between the blind via-hole 25 and the metal film 7a is increased. Furthermore, since the base film inner wall 23 is recessed, the contact area between the blind via-hole 25 and the second conductive pattern 4 is also increased. With this structure, the flexible printed circuit board 21 can have improved reliability compared with the flexible printed circuit board 1 in FIG. 1.

The lower limit of the difference calculated by subtracting the minimum inner diameter $R_2$ of the metal film portion from the maximum inner diameter $R_3$ of the base film portion is preferably 1 μm, and more preferably 3 μm. The upper limit of the difference is preferably 30 μm, and more preferably 15 μm. When the difference is less than the lower limit, a sufficient effect of suppressing separation of the blind via-hole 25 may not be obtained. When the difference exceeds the upper limit, the cross-sectional area of the blind via-hole 25 of the base film 2 portion is excessively large, and the area of the blind via-hole 25 increases, which may result in impairment of flexibility.

[Method for Producing Flexible Printed Circuit Board]

A method for producing the flexible printed circuit board 21 includes a step (through-hole formation step) of preparing a base material 9 including a base film 2 having insulating properties and flexibility and a pair of metal films 7a and 7b stacked on both surface sides of the base film 2, and forming a through-hole 26 in the metal film 7a on a front surface side of the base material 9 and the base film 2; a step (filling step) of stacking, by electroplating on a front surface of the base material 9, a conductive material on a surface of the metal film 7a on the front surface side to form a conductive material layer 8 and to fill the through-hole 26 with the conductive material; and a step (removal step) of removing, by etching the front surface of the base material 9, a surface layer of the conductive material layer stacked on the surface of the metal film 7a on the front surface side and a surface layer of the conductive material filling the through-hole 26. In the through-hole formation step, the through-hole 26 is formed so that a maximum inner diameter of a base film 2 portion in the through-hole is larger than a minimum inner diameter of a metal film 7a portion in the through-hole 26.

(Through-Hole Formation Step)

Figure 5A:
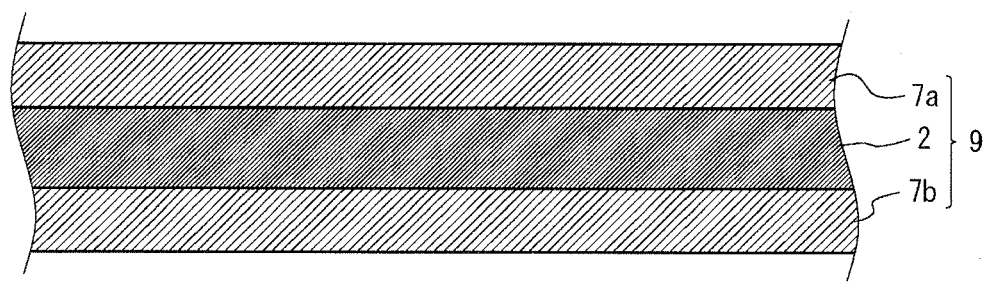
FIG. 5A is a schematic sectional view illustrating a method for producing the flexible printed circuit board in FIG. 4.

In the through-hole formation step, a base material 9 in which a pair of metal films 7a and 7b are stacked on both surface sides of a base film 2 is prepared as illustrated in FIG. 5A.

Figure 5B:
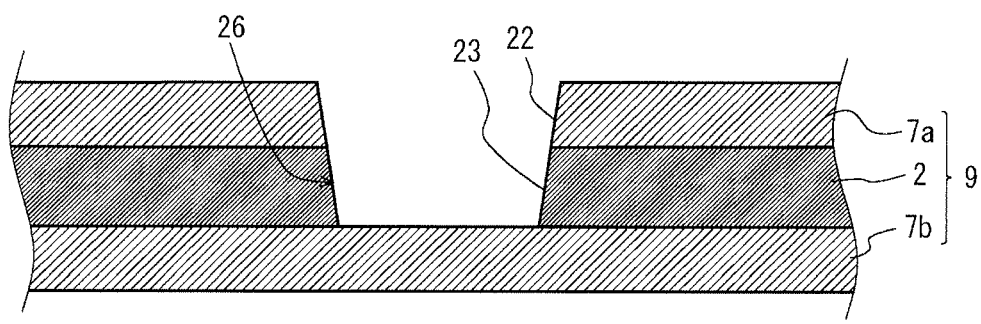
FIG. 5B is a schematic sectional view illustrating a step of producing the flexible printed circuit board in FIG. 4, the step being performed subsequent to the step illustrated in FIG. 5A.

First, the metal film 7a on the front surface side of the base material 9 illustrated in FIG. 5A is machined with a laser, and the base film 2 is subsequently machined with a laser to form a through-hole 26 in the metal film 7a on the front surface side and the base film 2, as illustrated in FIG. 5B. In this case, the through-hole 26 is formed so that a metal film layer inner wall 22 and a base film inner wall 23 are continuous.

Figure 5C:
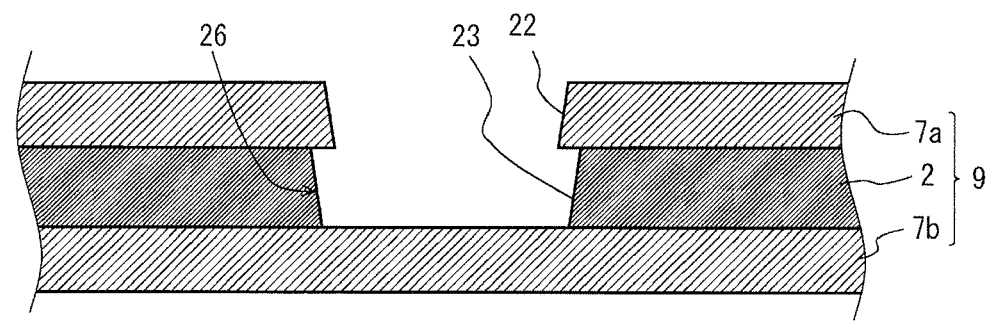
FIG. 5C is a schematic sectional view illustrating a step of producing the flexible printed circuit board in FIG. 4, the step being performed subsequent to the step illustrated in FIG. 5B.

Next, residues are removed by desmearing. A part of the base film inner wall 23 is also removed by this desmearing. Specifically, the base film inner wall 23 is recessed with respect to the metal film layer inner wall 22 by this desmearing. Through this step, a maximum inner diameter of a base film 2 portion becomes larger than a minimum inner diameter of a metal film 7a portion in the through-hole 26, as illustrated in FIG. 5C.

The formation of the through-hole 26 may be performed by another method as long as the maximum inner diameter of the base film 2 portion becomes larger than the minimum inner diameter of the metal film 7a portion. Unlike the above method in which, after the formation of the through-hole 26, processing is performed so as to recess the base film inner wall 23, a through-hole 26 having a shape in which the base film inner wall 23 is recessed with respect to the metal film layer inner wall 22 may be originally formed. Specifically, for example, a through-hole is formed only in the metal film 7a on the front surface side, and the base film 2 is removed by etching using, as a mask, the metal film 7a having the through-hole and disposed on the front surface side. In this case, the etching is performed so that the base film inner wall 23 is recessed with respect to the metal film layer inner wall 22. Thus, the through-hole 26 in which the maximum inner diameter of the base film 2 portion is larger than the minimum inner diameter of the metal film 7a portion can be formed as illustrated in FIG. 5C.

(Filling Step)

Figure 5D:
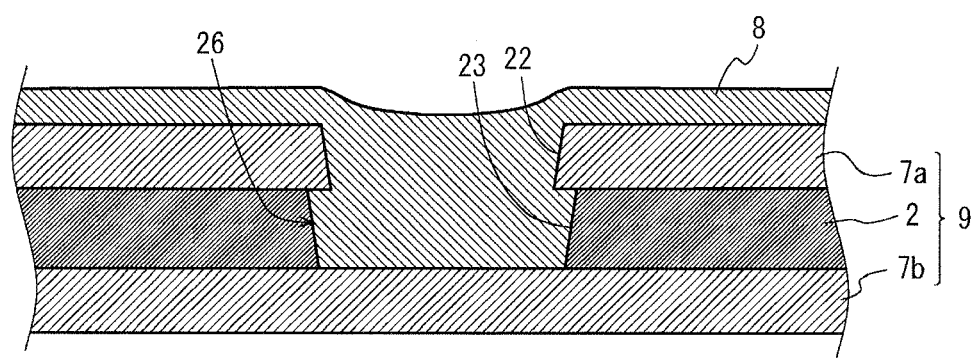
FIG. 5D is a schematic sectional view illustrating a step of producing the flexible printed circuit board in FIG. 4, the step being performed subsequent to the step illustrated in FIG. 5C.

In the filling step, as illustrated in FIG. 5D, a conductive material is stacked on a surface of the metal film 7a on the front surface side by electroplating to form a conductive material layer 8 and to fill the through-hole 26 with the conductive material.

Via-filling plating is applied to the electroplating. In this case, a plating solution has a low fluidity on the back surface side of the metal film 7a in which the base film inner wall 23 is recessed with respect to the metal film layer inner wall 22. Since plating is easily grown in a region where the fluidity is low, the conductive material densely fills the back surface side of the metal film 7a.

(Removal Step)

Figure 5E:
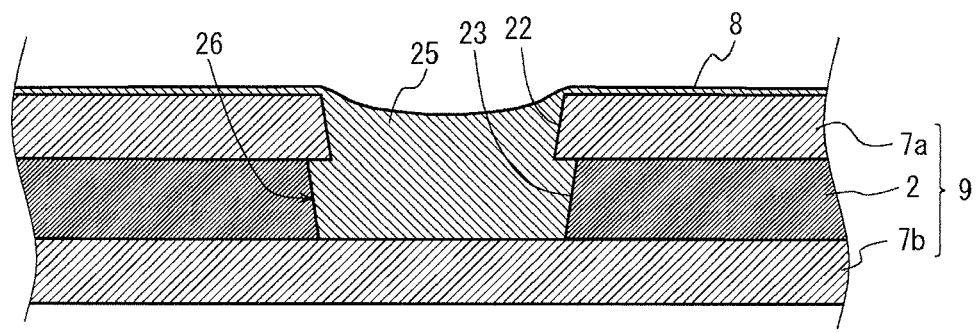
FIG. 5E is a schematic sectional view illustrating a step of producing the flexible printed circuit board in FIG. 4, the step being performed subsequent to the step illustrated in FIG. 5D.

In the removal step, the front surface of the base material 9 in FIG. 5D is etched to remove a surface layer of the conductive material layer 8 stacked on the surface of the metal film 7a on the front surface side and a surface layer of the conductive material filling the through-hole 26. Thus, a blind via-hole 25 and a thin film-like conductive material layer 8 are formed as illustrated in FIG. 5E.

Advantages

According to the method for producing a flexible printed circuit board, in the through-hole formation step, the maximum inner diameter of the base film 2 portion in the through-hole 26 is made larger than the minimum inner diameter of the metal film 7a portion in the through-hole 26. Consequently, the blind via-hole 25 formed by filling the through-hole 26 with a conductive material in the filling step has a shape in which the blind via-hole 25 is engaged by the metal film portion protruding into the through-hole with respect to the base film portion. Thus, a flexible printed circuit board including a blind via-hole that is unlikely to separate can be produced.

In addition, since the blind via-hole 25 of the flexible printed circuit board is in contact with a portion of the back surface of the metal film 7a on the front surface side, the contact area between the blind via-hole 25 and the metal film 7a is increased, and high reliability is obtained.

Other Embodiments

It is to be understood that the embodiments disclosed herein are only illustrative and are not restrictive in all respects. The scope of the present invention is not limited to the configurations of the embodiments but is defined by the claims described below. It is intended that the scope of the present invention includes the meaning of equivalents of the claims and all modifications within the scope of the claims.

In the embodiments, a description has been made using, as an example, a flexible printed circuit board including a double-sided substrate. However, the flexible printed circuit board can be used in, for example, a rigid-flexible printed circuit board in which a flexible printed circuit board and a rigid printed circuit board are combined or a build-up substrate having a multilayer structure.

The shape of the blind via-hole is not limited to a substantially columnar shape as described in the embodiments. The blind via-hole may have a shape in which an average diameter of the blind via-hole is not uniform (such as a shape in which the diameter increases or decreases from the lower surface toward the upper surface or a shape having a narrow portion) depending on the production method. The sectional shape is also not limited to a round shape and may be, for example, a polygonal shape.

The flexible printed circuit board 21 of the third embodiment has a structure in which the first conductive pattern 3 includes the conductive material layer 8. Alternatively, as in the second embodiment, the first conductive pattern may be formed of only a metal film without including a conductive material layer.

INDUSTRIAL APPLICABILITY

According to the method for producing a flexible printed circuit board of the present invention, a flexible printed circuit board having good flexibility can be produced at a low cost. Therefore, the method for producing a flexible printed circuit board can be suitably used in, for example, a flexible printed circuit board for which a high-accuracy circuit design is required.

| | Reference Signs List |
|---|---|
| 1 | flexible printed circuit board |
| 2 | base film |
| 3 | first conductive pattern |
| 4 | second conductive pattern |
| 5 | blind via-hole |
| 6 | through-hole |
| 7a, 7b | metal film |
| 8 | conductive material layer |
| 9 | base material |
| 11 | flexible printed circuit board |
| 13 | first conductive pattern |
| 15 | blind via-hole |
| 21 | flexible printed circuit board |
| 22 | metal film layer inner wall |
| 23 | base film inner wall |
| 25 | blind via-hole |
| 26 | through-hole |
| F | through-hole peripheral region |
| $R_1$ | average opening diameter |
| $R_2$ | minimum inner diameter of metal film portion |
| $R_3$ | maximum inner diameter of base film portion |

The invention claimed is:

1. A flexible printed circuit board comprising:
a base film having insulating properties and flexibility;
a first conductive pattern stacked on a front surface side of the base film;
a second conductive pattern stacked on a back surface side of the base film; and
a blind via-hole penetrating the first conductive pattern and the base film,
wherein the blind via-hole is a pillar-shaped filler of a conductive material formed in a through-hole penetrating the first conductive pattern and the base film, and
a front surface of the first conductive pattern has an arithmetic mean roughness Ra of 0.05 μm or more and 0.7 μm or less,
wherein the first conductive pattern has a metal film and a conductive material layer plated on the front surface side of the metal film, and the conductive material layer has an average thickness of 2 μm or less in a region within 0.2 mm from the center of the blind via-hole,
wherein an average diameter of the blind via-hole on a frontmost surface side is 10 μm or more and 100 μm or less.

2. The flexible printed circuit board according to claim 1, wherein a volume ratio of the blind via-hole relative to a capacity of the through-hole is 60% or more.

3. The flexible printed circuit board according to claim 1, wherein the first conductive pattern and the conductive material contain copper as a main component.

4. The flexible printed circuit board according to claim 1,
wherein an inclination angle of an inner wall surface of the metal film in a section including a central axis of the through-hole with respect to the front surface of the base film is 60° or more and 89° or less.

* * * * *